(12) United States Patent
Trivedi et al.

(10) Patent No.: US 6,477,086 B2
(45) Date of Patent: Nov. 5, 2002

(54) LOCAL SENSING OF NON-VOLATILE MEMORY

(75) Inventors: Ritesh Trivedi, Fair Oaks; Mark Bauer, Placerville; Sandeep Guliani, Folsom; Balaji Srinivasan, Fair Oaks; Kerry Tedrow, Folsom, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/752,936

(22) Filed: Dec. 29, 2000

(65) Prior Publication Data

US 2002/0085424 A1 Jul. 4, 2002

(51) Int. Cl.⁷ .............................................. G11C 16/06
(52) U.S. Cl. ............................ 365/185.21; 365/185.22; 365/185.11
(58) Field of Search .................. 365/185.21, 185.11, 365/185.22, 185.33, 230.03, 230.06, 200, 189.02, 205, 207

(56) References Cited

U.S. PATENT DOCUMENTS

| | | | |
|---|---|---|---|
| 4,763,026 A | 8/1988 | Tsen et al. | |
| 5,423,047 A | 6/1995 | Leak | |
| 5,508,958 A | 4/1996 | Fazio et al. | |
| 5,539,690 A | 7/1996 | Talreja et al. | |
| 5,594,360 A | 1/1997 | Wojciechowski | |
| 5,671,179 A | 9/1997 | Javanifard | |
| 5,748,546 A | 5/1998 | Bauer et al. | |
| 5,793,671 A | 8/1998 | Selcuk | |
| 5,821,806 A | 10/1998 | Pascucci | |
| 5,828,616 A | 10/1998 | Bauer et al. | |
| 5,912,838 A | 6/1999 | Chevallier | |
| 5,969,986 A * | 10/1999 | Wong et al. | 365/185.03 |
| 5,986,937 A | 11/1999 | Yero | |
| 6,097,633 A | 8/2000 | La Placa | |
| 6,141,252 A | 10/2000 | Chen | |
| 6,151,271 A * | 11/2000 | Lee | 365/194 |
| 6,240,040 B1 * | 5/2001 | Akaogi et al. | 365/230.06 |
| 6,260,103 B1 * | 7/2001 | Alexis et al. | 365/185.11 |
| 6,269,040 B1 | 7/2001 | Reohr et al. | |
| 6,310,805 B1 * | 10/2001 | Kasa et al. | 365/196 |
| 6,320,808 B1 | 11/2001 | Conte et al. | |
| 6,330,186 B2 | 12/2001 | Tanaka | |

FOREIGN PATENT DOCUMENTS

JP    6187074    7/1994

* cited by examiner

*Primary Examiner*—David Lam
(74) *Attorney, Agent, or Firm*—Blakely, Sokoloff, Taylor & Zafman LLP

(57) ABSTRACT

According to the invention, an apparatus and method are disclosed for sensing the contents of non-volatile memory. According to one embodiment, a set of local sensing circuits is used to read the logical values stored in memory cells contained within a partition of a non-volatile memory device.

31 Claims, 5 Drawing Sheets

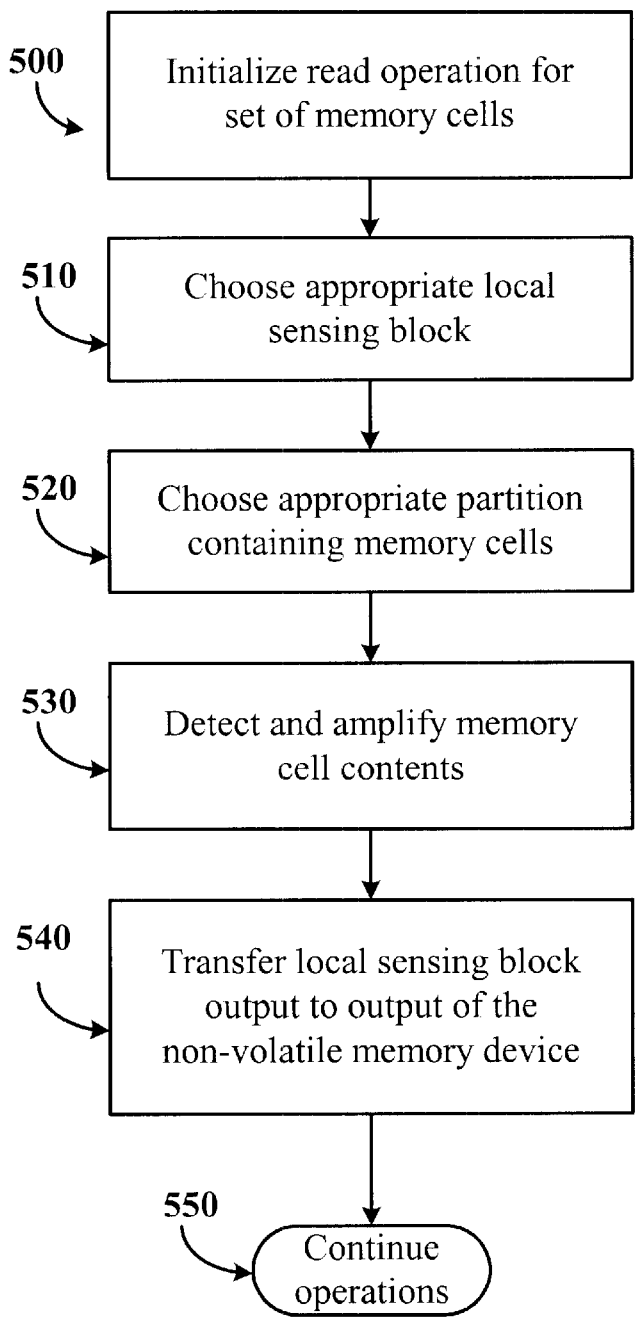
Figure 5 — Sensing Operation of Non-Volatile Memory Device

LOCAL SENSING OF NON-VOLATILE MEMORY

FIELD OF THE INVENTION

This invention relates to computer memory in general, and more specifically to sensing data that is stored in non-volatile memory.

BACKGROUND OF THE INVENTION

Non-volatile semiconductor memory is memory that can retain information when a power supply is switched off. Non-volatile memory, such as flash memory, is being used increasingly in electronic devices for personal and commercial use, including cellular telephones, digital cameras, embedded devices, and personal data assistants. Technology has made it possible to produce flash memory that is increasingly dense, resulting in greater and greater amounts of memory being available to electronic products. In order to reduce the power consumption of these products, there has also been an attempt to operate flash memory at lower voltages. The combination of greater memory density, demands for better read performance at increasing speed, and lower supply voltages has created design challenges.

In addition, the operation of non-volatile memory has changed. Rather than operating such that read functions and write functions do not occur at the same time, non-volatile memory is developing into read-while-write operations, in which some memory cells may be written to at the same time that other memory cells are read. The need to provide flexibility to support read-while-write operations has introduced further challenges in the design of non-volatile memory.

Flash memory is composed of memory cells that are typically arranged in an array of rows and columns. The memory cells then may be combined to form memory blocks or other larger units of memory cells. In utilizing such flash memory, sensing circuits are provided to determine what logical value is stored within each of the memory cells. The data signal each memory cell produces is small and thus a sensing amplifier is used to determine the cell contents. Typically, a single set of sensing amplifier circuits, which may be termed "global sensing circuits", is used for a flash memory array, as is shown in FIG. 1. In this example, a sense node connects the memory cells to the global sensing circuits. The use of global sensing circuits requires that the sense node remain active at any time the contents of a flash memory cell are read. Because the sense node is in constant operation and extends physically across the memory cell array, the sense node has significant capacitance. The charging of this node causes a reduction in read speed, an increase in power consumption, and a possible need for an increase in device sizes to improve the read performance.

As the size of a non-volatile memory array is increased, the sense node connecting the memory cells to the sensing amplifier circuits will increase in length, thereby increasing the parasitic capacitance and power consumption of the non-volatile memory device. These factors limit the speed and size of non-volatile memory devices.

FIG. 1 illustrates the structure of a conventional non-volatile memory device. FIG. 1 does not show all aspects of a non-volatile memory device, but instead is limited to the features that are most relevant to the sensing of non-volatile memory content. Within the non-volatile memory device 100, there is a plurality of memory cells 110. In this illustration, the array of memory cells 110 is divided into a first array of memory cells 120 and a second array of memory cells 130. Between first array 120 and second array 130, there are multiplexers (or Y-decoders) 150, which choose the signals that are subject to the sensing operation. Connected to multiplexers 150 is sense node 140. Sense node 140 traces through the memory device 100 to a plurality of global sensing circuits 160, which serve to detect and amplify the signals from the appropriate memory cells. The output of global sensing circuits 160 then becomes an output 170 of memory device 100. In this illustration, the signal representing the stored content of any memory cell within memory device 100 will be conducted by sense node 140, and thus sense node 140 remains active for any read operation.

BRIEF DESCRIPTION OF THE DRAWINGS

The appended claims set forth the features of the invention with particularity. The invention, together with its advantages, may be best understood from the following detailed description taken in conjunction with the accompanying drawings, of which:

FIG. 5 is a flow diagram illustrating one embodiment of the operation of a non-volatile memory device.

DETAILED DESCRIPTION

A method and apparatus are described for sensing the contents of non-volatile memory.

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention includes various steps, which will be described below. The steps of the present invention may be performed by hardware components or may be embodied in machine-executable instructions, which may be used to cause a general-purpose or special-purpose processor or logic circuits programmed with the instructions to perform the steps. Alternatively, the steps may be performed by a combination of hardware and software.

In one embodiment, the architecture of a non-volatile memory device is modified such that the array of memory cells is divided into a plurality of partitions, where a partition is a set of memory cells that may contain one or more blocks of memory cells. A partition may also be referred to as a memory plane. In a further embodiment, the memory device will contain multiple sets of local sensing circuits, said sets being referred to as "local sensing blocks". In this embodiment, the local sensing blocks are used to sense the contents of memory cells within certain partitions of the memory device. This contrasts with a conventional memory device containing a single set of global sensing circuits for the entire memory device. Instead of global sensing, in this embodiment each partition or group of partitions has a dedicated local sensing block. A local sensing block is physically placed near the relevant partitions of memory cells. According to one embodiment, the local sensing block includes a set of local sensing devices that are used for memory cell read operations and a set of sensing circuits that are used for memory cell verify operations.

In one embodiment, a local sensing block is provided in the non-volatile memory device for each two partitions of the memory array. However, many different variations are possible regarding the number of local sensing blocks and the number of partitions assigned to each local sensing block, with various design trade-offs occurring dependent on the particular choices that are made.

Figure 1:
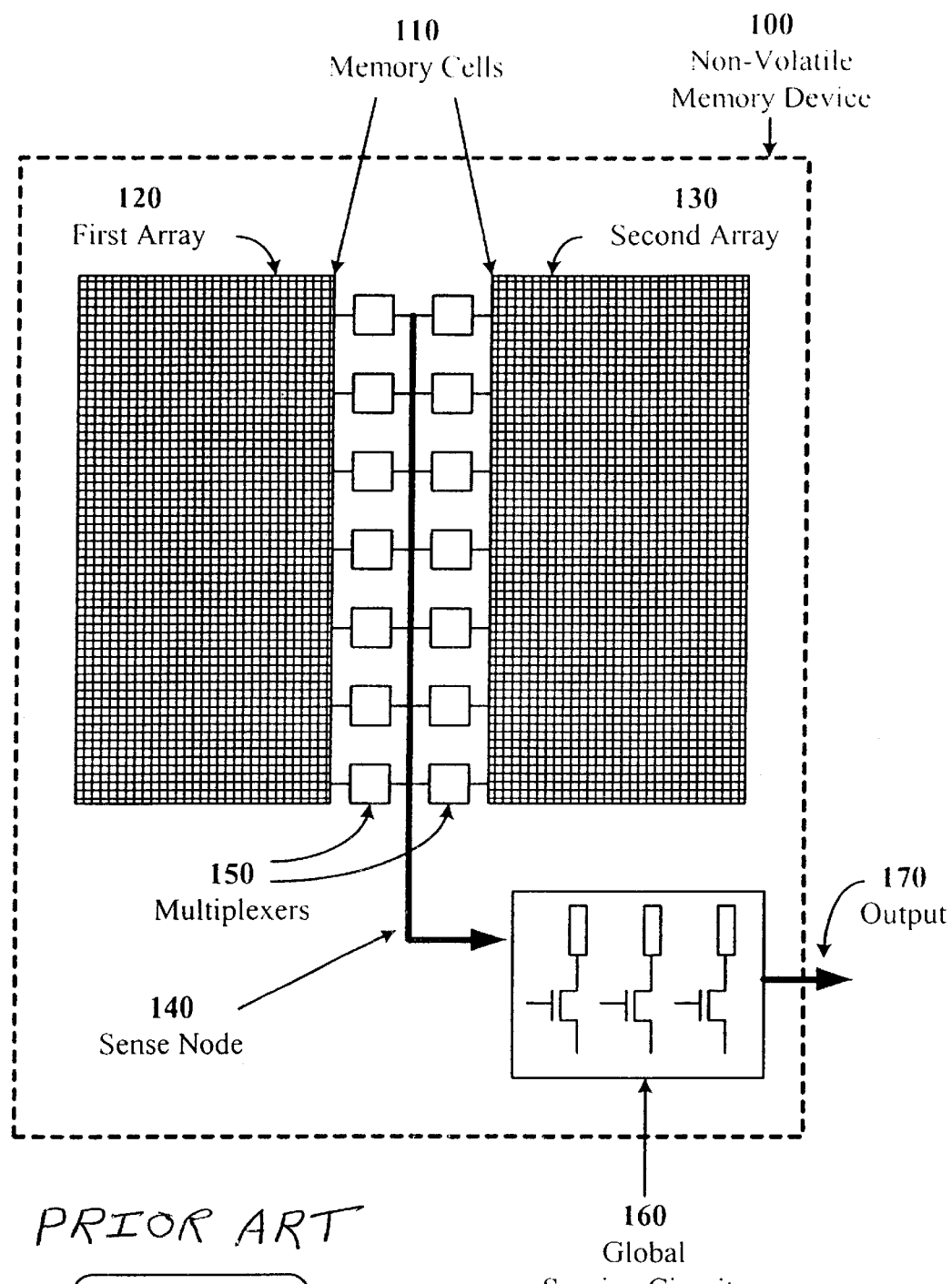
FIG. 1 is an illustration of conventional global sensing circuits in a non-volatile memory device.

The use of local sensing blocks increases the number of sensing circuits that are necessary for operation of a non-volatile memory device, thereby increasing the total number of circuits that are needed for the memory device and the amount of physical area on the device that is devoted to the sensing circuitry. However, there are advantages that result from the use of local sensing circuits that offset some of the physical area requirements. According to one embodiment, there is a sense node for each two partitions of the memory array. To sense the contents of memory cells in any partition of the memory array, only the sense node that connects the two relevant partitions of the memory array to the sensing circuits for said partitions is charged, rather than charging the sense node for the entire memory array, as was required for the conventional global sensing circuits illustrated in FIG. 1. This embodiment thus reduces the length of the sense node that is powered during a sensing operation, thereby reducing the level of parasitic capacitance. This improves speed and power consumption during read operations.

The significant reduction in sense node capacitance according to one embodiment allows for the use of smaller sensing circuits that consume less power. The use of the lower power sensing circuits is inherently slower in the memory device, but, with the reduction in parasitic capacitance that is possible utilizing this embodiment, the resulting speed for the non-volatile memory device may be as fast or faster than conventional designs.

Local sensing of memory cells may require a modification in the multiplexing of signals. Instead of multiplexing the signals from the sense node to choose the signals that will be the input to a set of global sensing circuits, the outputs of the local sensing blocks may be multiplexed to choose the appropriate signals for the output of the memory device. In one embodiment in which one local sensing block is present for each two partitions of a memory device, multiplexing is included to choose which of the two partitions will be sensed by the local sensing block during a particular read operation.

In addition to numerous other advantages, local sensing of memory cells within a given partition of a non-volatile memory device may be accomplished with only the sensing circuits within the assigned local sensing block being active. The other local sensing blocks in this example do not need to be active, thereby reducing the interference that might occur with write operations to other partitions in the memory device. This feature allows more flexibility for providing read-while-write operations in non-volatile memory architecture.

Figure 2:
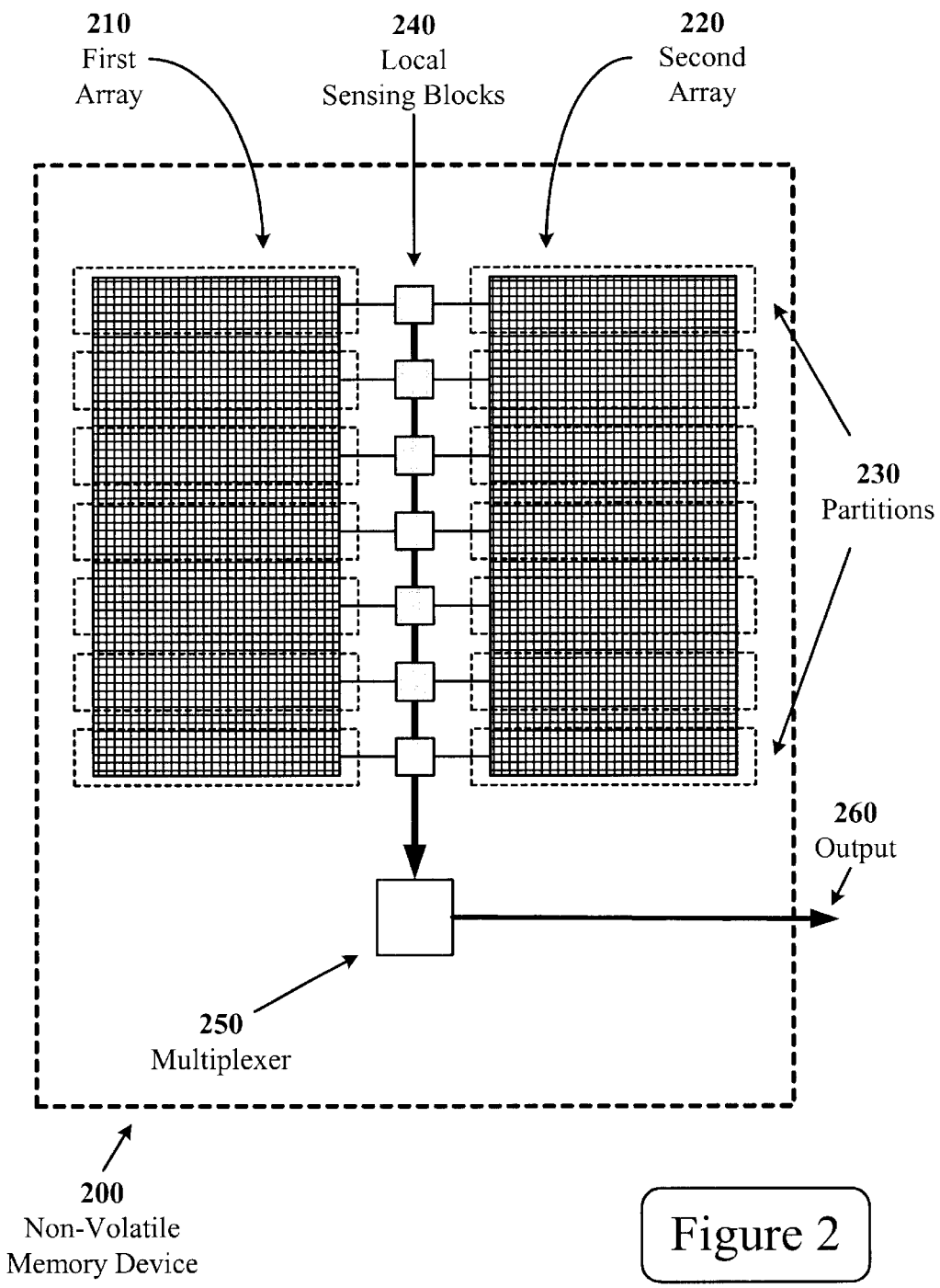
FIG. 2 is an illustration of one embodiment utilizing local sensing circuits.

FIG. 2 illustrates the structure of one embodiment. The non-volatile memory device 200 includes a first array of memory cells 210 and a second array of memory cells 220. Arrays 210 and 220 are divided into a plurality of partitions 230. Within memory device 200 are a plurality of local sensing blocks 240, each comprising a plurality of local sensing circuits. In this illustration, there is a local sensing block for each two partitions. The outputs of local sensing blocks 240 are connected to multiplexer 250. The signals chosen by multiplexer 250 form an output 260 of memory device 200.

Figure 3:
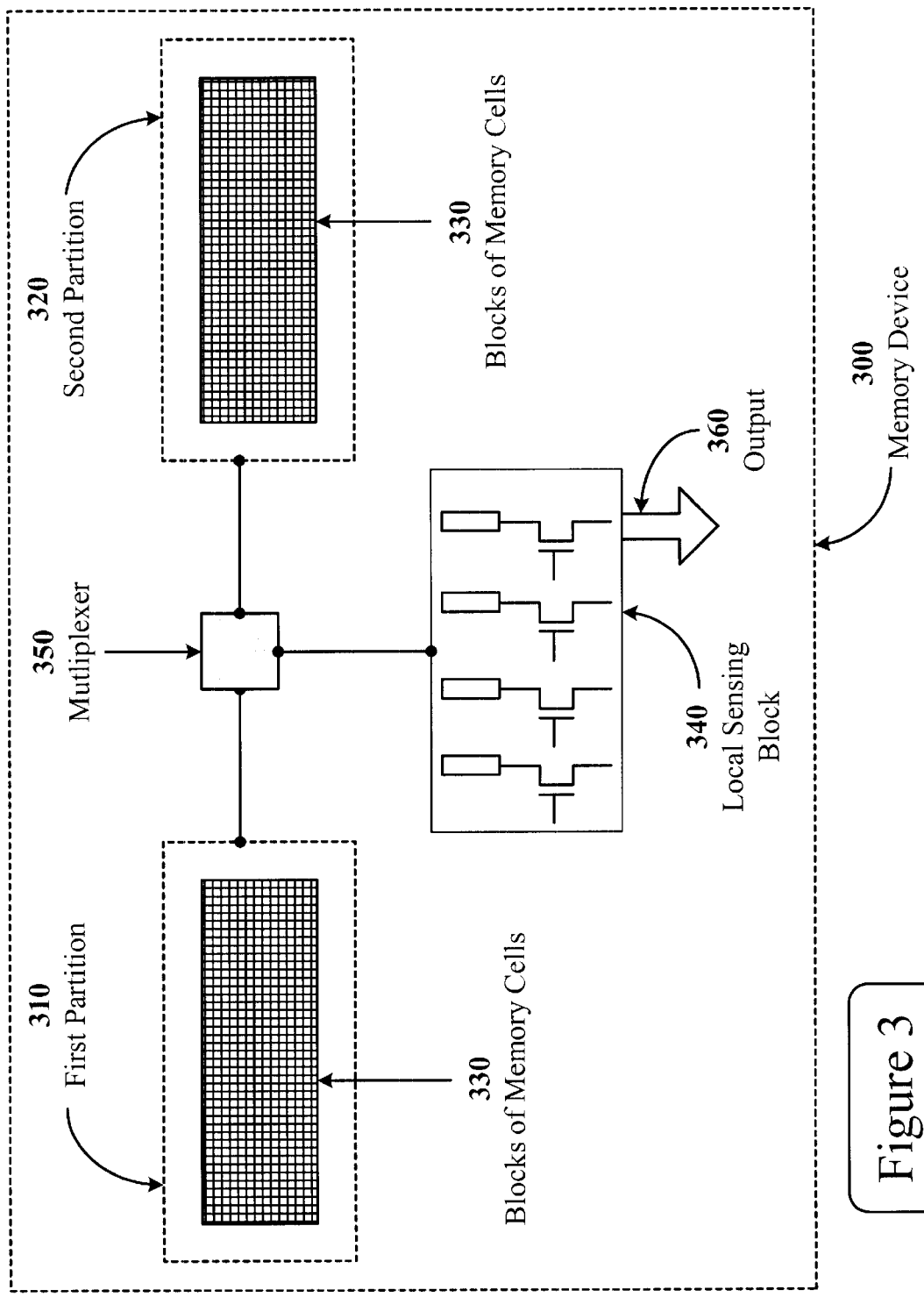
FIG. 3 illustrates one embodiment of two partitions of memory cells and the assigned local sensing block for these two partitions.

FIG. 3 illustrates one embodiment of the structure of two partitions in a non-volatile memory device 300. In this illustration, first partition 310 and second partition 320 each include blocks of memory cells 330. First partition 310 and second partition 320 share local sensing block 340, which contains a set of local sensing circuits. The signals from either first partition 310 or second partition 320 are chosen by multiplexing device 350 to be the input to local sensing block 340. The output 360 of local sensing block 340 is then multiplexed with the outputs of local sensing blocks for other partitions, which is not shown in this illustration.

Figure 4:
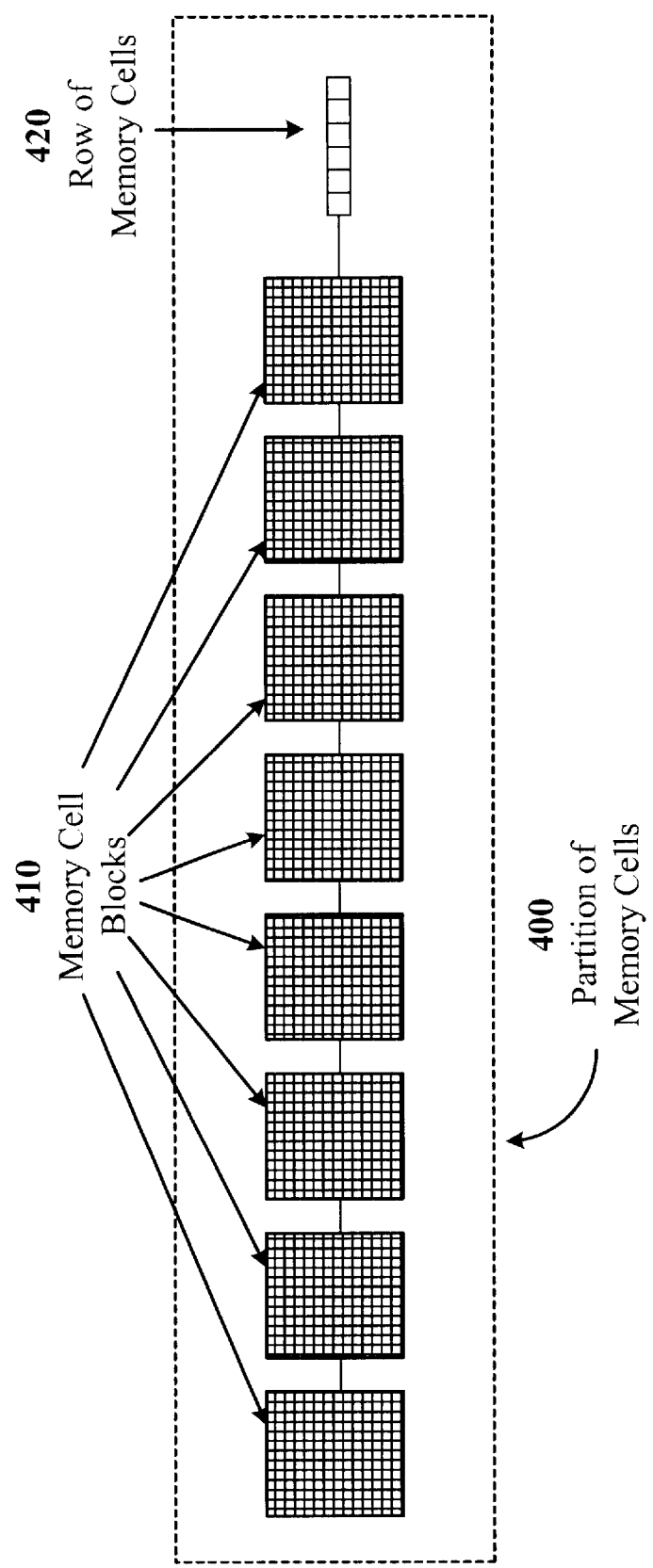
FIG. 4 illustrates one embodiment of the structure of a partition of memory cells.

FIG. 4 presents an embodiment of the structure of a partition in a memory array, with said partition also referred to as a "plane". In this embodiment, a partition of non-volatile memory cells 400 is comprised of blocks of memory cells 410 and a single row array of reference memory cells 420. In this particular embodiment, partition 400 includes eight blocks of memory cells and a single row array of 256 memory cells. Each block of the array comprises 512K memory cells in an array of 512 rows and 1024 columns. The structure of a memory partition shown in FIG. 4 is an example of a memory partition and does not limit the memory structures that may be present in a memory device. Many different memory structures can be used.

The flow diagram shown in FIG. 5 represents one embodiment of a local sensing operation of a non-volatile memory device. A read operation is initialized for a set of memory cells, process block 500. The signals for the appropriate local sensing block are chosen, process block 510, and the appropriate partition among those assigned to the local sensing block is chosen, process block 520. The signals of the memory cells are detected and amplified by the sensing circuits within the local sensing block, process block 530. The output of the local sensing block is then transferred to the output of the non-volatile memory device, process block 540. The other operations of the system then continue, process block 550.

What is claimed is:

1. A non-volatile memory device comprising:
  a first array of memory cells, the array of memory cells including a plurality of partitions, each partition comprising one or more of the plurality of memory cells, each memory cell being included in only one of the partitions; and
  a plurality of sensing circuit blocks, each sensing circuit block being associated with one or more partitions and each partition being associated with only one of the sensing circuit blocks, each sensing circuit block sensing only the contents of the memory cells within the one or more partitions associated with the circuit sensing block.

2. The non-volatile memory device of claim 1, wherein each sensing circuit block includes a first set of sensing circuits and a second set of sensing circuits, the first set of sensing circuits performing read operations for the one or more partitions associated with the sensing circuit block and the second set of sensing circuits performing verify operations for the one or more partitions associated with the sensing circuit block.

3. The non-volatile memory device of claim 1, further comprising a multiplexer, the multiplexer choosing between outputs of the plurality of sensing circuit blocks for the output of the non-volatile memory device.

4. The non-volatile memory device of claim 1, further comprising a second array of memory cells, each sensing circuit block being associated with one partition in the first array of memory cells and one partition in the second array of memory cells.

5. The non-volatile memory device of claim 4, wherein each sensing circuit block is physically located between the associated partition in the first array of memory cells and the associated partition in the second array of memory cells.

6. The non-volatile memory device of claim 1, wherein each partition is comprised of one or more blocks of memory cells and one or more reference cells.

7. The non-volatile memory device of claim 1, wherein each sensing circuit block is connected to each partition associated with the sensing circuit block by a sense node and wherein the sense node is not powered if the sensing circuit block is not active.

8. The non-volatile memory device of claim 1, wherein the memory cells are flash memory cells.

9. A non-volatile memory device comprising:
  a first array of memory cells, the first array of memory cells being divided into a plurality of partitions, each partition comprising a plurality of memory cells of the array, each memory cell being included in only one of the partitions; and
  a plurality of sensing circuit blocks, each sensing circuit block being coupled to a partition in the first array of memory cells and each partition in the first array of memory cells being coupled to only one sensing circuit block, each sensing circuit block including:
    a set of read sensing circuits that are utilized in read operations for the partition coupled to the sensing circuit block, and
    a set of verify sensing circuits that are utilized in verification in write operations for the partition coupled to the sensing circuit block.

10. The non-volatile memory device of claim 9, wherein the array of memory cells is a flash memory cell array.

11. The non-volatile memory device of claim 9, further comprising a second array of memory cells, each sensing circuit block also being coupled to one partition in the second array of memory cells.

12. The non-volatile memory device of claim 11, further comprising a multiplexer, the multiplexer choosing between outputs of the plurality of sensing circuit blocks for an output of the non-volatile memory device.

13. The non-volatile memory device of claim 12, wherein each sensing circuit block is physically located between the coupled partition in the first array of memory cells and the coupled partition in the second array of memory cells.

14. The non-volatile memory device of claim 9, wherein each partition is comprised of one or more blocks of memory cells and one or more reference cells.

15. The non-volatile memory device of claim 9, wherein each sensing circuit block is coupled to the respective partition via a sense node and wherein the sense node is not powered if the sensing circuit block is not active.

16. A local sensing block to sense the contents of non-volatile memory cells, comprising:
  a plurality of read sensing circuits, the plurality of read sensing circuits sensing the contents of one or more memory cells during a read operation;
  a plurality of verify sensing circuits, the plurality of verify sensing circuits verifying the contents of one or more memory cells as part of a write operation; and
  a connection via a sense node to a first partition of a first array of memory cells, the first partition being one of a plurality of partitions of the array, each memory cell in the first array being included in only one of the partitions of the first array, the only memory cells in the first array that may be accessed by the plurality of read sensing circuits and the plurality of verify sensing circuits being memory cells within the first partition.

17. The local sensing block of claim 16, wherein the memory cells in the first array are flash memory cells.

18. The local sensing block of claim 16, further comprising a connection via the sense node to a partition in a second array of memory cells, the first array and the second array being sub-parts of a memory device.

19. The local sensing block of claim 18, further comprising a connection to a multiplexer, the multiplexer choosing an output of the memory device from the output of the local sensing block and outputs of one or more additional local sensing blocks.

20. The local sensing block of claim 19, wherein the local sensing block is physically located between the connected partition in the first array and the connected partition in the second array.

21. The local sensing block of claim 20, wherein the sense node is not powered if the local sensing block is not active.

22. A method for sensing contents of non-volatile memory cells comprising:
  connecting a plurality of sensing circuits to a first plurality of memory cells in a non-volatile memory device, the first plurality of memory cells comprising less than all of the memory cells in a first memory array; and
  sensing the contents of one or more memory cells within the first plurality of memory cells using the plurality of sensing circuits, the memory cells in the first memory that may be sensed by the plurality of sensing circuits being limited to memory cells that are within the first plurality of memory cells.

23. The method of claim 22, wherein the non-volatile memory device is a flash memory device.

24. The method of claim 22, wherein the plurality of sensing circuits comprises:
  a plurality of read sensing circuits for sensing memory contents when reading from memory cells; and
  a plurality of verify sensing circuits for verifying memory contents when writing to memory cells.

25. The method of claim 24, further comprising connecting the plurality of sensing circuits to a second plurality of memory cells in the non-volatile memory device, the second plurality of memory cells comprising less than all of the memory cells in a second memory array.

26. The method of claim 22, wherein the plurality of memory cells is comprised of one or more blocks of memory cells and one or more reference cells.

27. A method for sensing contents of non-volatile memory cells comprising:
  selecting a set of one or more memory cells within a memory array of a non-volatile memory device;
  choosing a first partition of memory cells within the non-volatile memory device that contains the set of memory cells, the non-volatile memory device comprising a plurality of partitions, the first partition including less than all of the memory cells in the memory array; and
  detecting the contents of the set of one or more memory cells using a set of local sensing circuits that are allocated to the partition of memory cells, the set of local sensing circuits detecting the contents of only memory cells that are within the first partition of memory cells.

28. The method of claim 27, wherein the memory array contains flash memory cells.

29. The method of claim 27, wherein the set of local sensing circuits includes:
   a plurality of read sensing circuits for sensing memory contents when reading from memory cells; and
   a plurality of verify sensing circuits for verifying memory contents when writing to memory cells.

30. A memory device comprising:
   a means for sensing the contents of a plurality of non-volatile memory cells within a first partition of an array of memory cells, the means being limited to sensing the contents of only memory cells in the first partition;
   a means for sensing the contents of a plurality of non-volatile memory cells within a second partition of the array of memory cells, the means being limited to sensing the contents of only memory cells in the second partition; and
   a means for choosing between sensed contents of memory cells within the first partition and sensed contents of memory cells within the second partition as an output of the memory device.

31. The memory device of claim 30, wherein a means for sensing the contents of a plurality of non-volatile memory cells includes:
   a means for reading the contents of the plurality of non-volatile memory cells; and
   a means for verifying the contents of the plurality of non-volatile memory cells.

* * * * *

UNITED STATES PATENT AND TRADEMARK OFFICE
CERTIFICATE OF CORRECTION

PATENT NO. : 6,477,086 B2
DATED : November 5, 2002
INVENTOR(S) : Trivedi et al.

It is certified that error appears in the above-identified patent and that said Letters Patent is hereby corrected as shown below:

Column 6,
Line 12, after second occurrence of "a", insert -- first --.

Signed and Sealed this

Eighteenth Day of March, 2003

JAMES E. ROGAN
*Director of the United States Patent and Trademark Office*